(12) United States Patent
Kim et al.

(10) Patent No.: US 7,906,361 B2
(45) Date of Patent: Mar. 15, 2011

(54) PHOTODETECTOR USING NANOPARTICLES

(75) Inventors: Sangsig Kim, Seoul (KR); Hyunsuk Kim, Seoul (KR); Eun Joo Jang, Daejeon-Si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 12/404,693

(22) Filed: Mar. 16, 2009

(65) Prior Publication Data

US 2010/0068845 A1    Mar. 18, 2010

Related U.S. Application Data

(63) Continuation of application No. 11/102,930, filed on Apr. 11, 2005, now abandoned.

(30) Foreign Application Priority Data

Nov. 11, 2004   (KR) .................................. 2004-91898

(51) Int. Cl.
    *H01L 31/0384*    (2006.01)
(52) U.S. Cl. ................. 438/63; 438/48; 438/57; 257/14; 257/103; 977/773

(58) Field of Classification Search .................... 438/63, 438/22, 48, 57; 257/14, 103, E31.008, E31.015, 257/E31.051
    See application file for complete search history.

(56) References Cited

U.S. PATENT DOCUMENTS

| 5,589,704 | A  | * | 12/1996 | Levine .......................... 257/436 |
| 6,710,366 | B1 | * | 3/2004  | Lee et al. ........................ 257/14 |
| 2005/0227373 | A1 |   | 10/2005 | Flandre et al. |

* cited by examiner

*Primary Examiner* — Thinh T Nguyen
(74) *Attorney, Agent, or Firm* — Cantor Colburn LLP

(57) ABSTRACT

The present invention relates to a photodetector using nanoparticles, and more particularly, to a novel photodetector wherein surfaces of nanoparticles synthesized by a wet colloidal process are capped with organic materials which then serve as channels for electron migration, or nanoparticles, from which organic materials capped on the surfaces of nanoparticles are removed to form a close-packed particle structure, directly serve to transport electrons. In accordance with specific embodiments of the present invention, it is possible to improve performance of the photodetector and simplify the manufacturing process thereof.

8 Claims, 5 Drawing Sheets

PHOTODETECTOR USING NANOPARTICLES

This application is a continuation of application Ser. No. 11/102,930 filed Apr. 11, 2005, which claims priority under 35 U.S.C. §119(a) to Korean Patent Application No. 2004-91898 filed on Nov. 11, 2004, both of which are herein incorporated by reference.

BACKGROUND OF THE INVENTION

1. Field of the Invention

The present invention relates to a photodetector using nanoparticles. More particularly, the present invention relates to a photodetector using nanoparticles with organic material-capped surfaces synthesized by a wet colloidal process, or close-packed nanoparticles formed by removal of surface-capped organic materials.

2. Description of the Related Art

As a conventional photodetector 10 using quantum effects, a structure taking advantage of quantum well (QW) effects is well known to those skilled in the art, as shown in FIG. 1. However, where light is irradiated in the direction vertical to QW layer 11 (direction a), optical pumping may occur (due to influence of an electrical field present in the vertical direction) relative to the light direction (i.e., in the direction horizontal to the QW layer 11) and as a result, high quantum efficiency is not obtained in the planar direction (direction a), which is present in a bulk form. Conversely, where light is irradiated in the direction horizontal to QW layer 11 (direction b), even though optical pumping may occur due to effects of quantum effects, it is difficult to collect light on a QW region that is physically several nanometers in size, thereby resulting in poor light receiving efficiency. In addition, the resulting photocurrent flows in the following route: quantum well (QW) layer 11→quantum barrier (QB) 12→quantum well (QW) layer 13, as shown in FIG. 2, thereby leading to lowered efficiency. Where it is desired to detect a wavelength in a far infrared region using such a conventional photodetector, several hundred QW layers 11, serving as channels, are required, thus necessitating a prolonged period of time and highly expensive equipment in fabricating the photodetector.

In the case of the photodetector made up of quantum dots, as has recently been reported, the quantum dots self-assemble when prepared by vapor phase o methods such as Metal Organic Chemical Vapor Deposition (MOCVD) and Molecular Beam Epitaxy (MBE). The basic structure of the quantum dot photodetector synthesized by such vapor phase methods takes a form in which self-assembled quantum dots are incorporated into a quantum well active layer in a conventional quantum well photodetector p-n structure. In this connection, the photodetector having such a structure suffers from the following problems:

1) Since quantum dots are not connected to one another and thus independently present due to characteristics inherent to synthesis methods used, an existing quantum barrier makes it difficult to efficiently generate photocurrent even when light is received and electrons are activated.

2) Since self-assembled quantum dots, which are prepared by MOCVD or MBE, have inevitably a barrier layer after formation of a monolayer, the thickness of a light-receiving region is too small, which in turn results in light scattering and very low efficiency of receiving light. In particular, when it is desired to receive infrared light, the active layer should have a thickness of several nanometers, but it is not easy to achieve this thickness.

3) Finally, the p-n structure entails complicated fabrication processes and poor efficiency of a light-receiving window.

SUMMARY OF THE INVENTION

Therefore, the present invention has been made in view of the above problems, and it is an object of the present invention to provide a photodetector capable of improving performance thereof and simplifying a manufacturing process, by using nanoparticles with organic material-capped or coated surfaces synthesized by a wet colloidal process, or close-packed nanoparticles formed by removal of surface-capped organic materials.

In accordance with an aspect of the present invention, the above and other objects can be accomplished by the provision of a photodetector, comprising a substrate; an insulating layer formed on the substrate; and two opposite electrodes disposed on the insulating layer, at a predetermined distance, wherein a nanocrystalline layer including nanoparticles with organic material-capped surfaces prepared by a wet colloidal synthesis method is formed between two opposite electrodes.

In accordance with another aspect of the present invention, there is provided a photodetector, comprising a substrate; an insulating layer formed on the substrate; and two opposite electrodes disposed on the insulating layer, at a predetermined distance, wherein a nanocrystalline layer including nanoparticles prepared by a wet colloidal synthesis method and close-packed by removal of surface-capped organic materials is formed between two opposite electrodes.

BRIEF DESCRIPTION OF THE DRAWINGS

The above and other objects, features and other advantages of the present invention will be more clearly understood from the following detailed description of exemplary embodiments taken in conjunction with the accompanying drawings, in which.

DESCRIPTION OF THE PREFERRED EMBODIMENTS

Now, the present invention will be described in more detail with reference to accompanying drawings.

Figure 1:
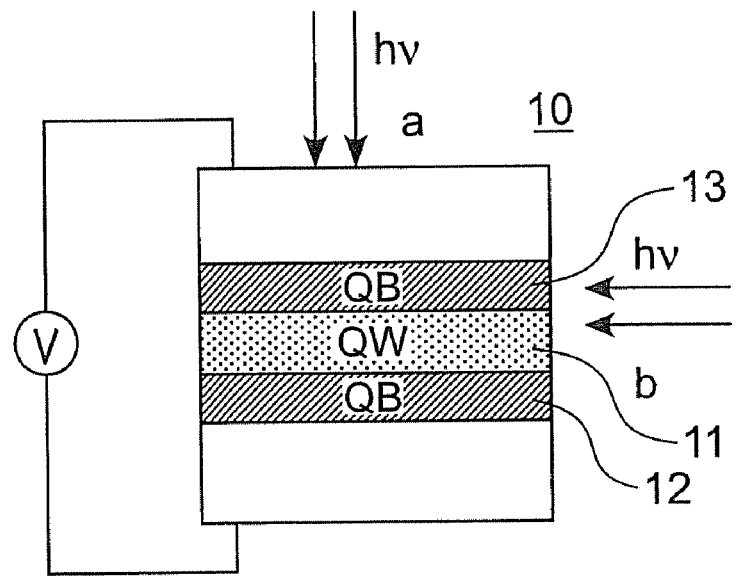
FIG. 1 shows a cross-sectional view of a photodetector using quantum effects in accordance with a conventional art.
Figure 2:
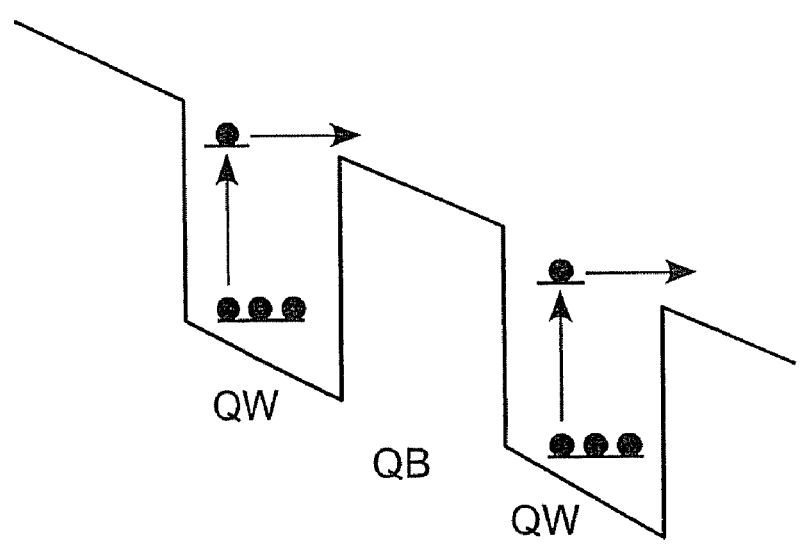
FIG. 2 schematically shows an operational principle of a photodetector using quantum effects in accordance with a conventional art.
Figure 3:
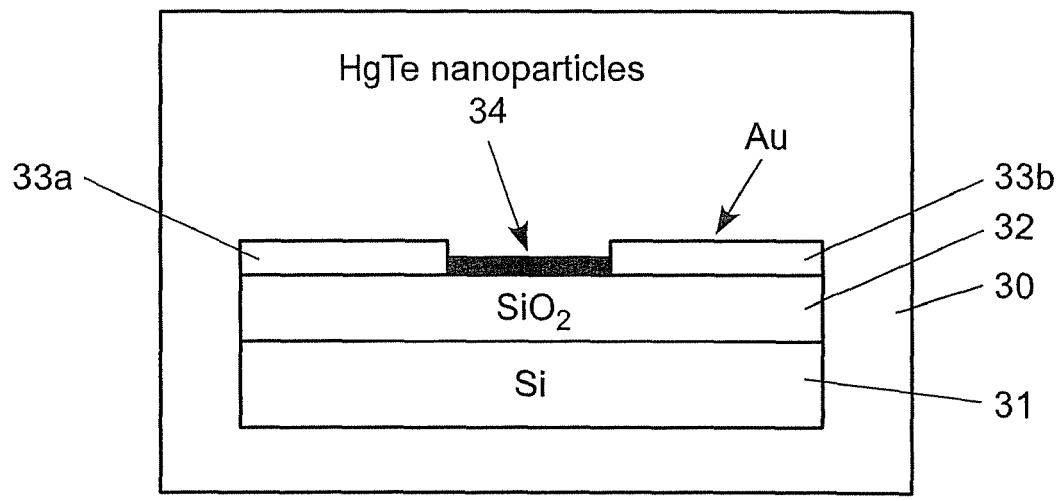
FIG. 3 shows a schematic cross-sectional view of a photodetector using nanoparticles in accordance with one embodiment of the present invention.

FIG. 3 shows a structure of a photodetector using nanoparticles in accordance with one embodiment of the present invention. Referring to FIG. 3, the photodetector 30 in accordance with the present invention has a structure in which an insulating layer 32 (e.g., $SiO_2$) is formed on a substrate 31, two opposite electrodes 33a, 33b are disposed on the insulating layer 32 at a predetermined distance and a nanocrystalline layer 34 composed of nanoparticles is disposed between two electrodes 33a, 33b, made of, for example, Au.

The photodetector 30 in accordance with the present invention having such a structure is synthesized by a wet colloidal process and comprises nanoparticles having surfaces capped with organic materials. Nanoparticles utilized in the present invention may be prepared by conventionally known wet colloidal synthesis methods and may be obtained by placing nanoparticle materials and organic materials for capping surfaces of nanoparticles in a solvent, and then reacting the mixture according to a wet colloidal synthesis method to prepare nanoparticles having surfaces capped with organic materials.

Using the wet colloidal synthesis method, it is advantageously possible to obtain nanoparticles exhibiting excellent crystallinity and it is relatively easy to control particle size and distribution, as compared to synthesis methods using MBE or MOCVD, and it is also possible to prepare particles having high surface density. In addition, there are provided advantages such as very low production costs, mass production and high competitiveness from the standpoint of commercialization in the near future, as compared to MBE or MOCVD.

Figure 4:
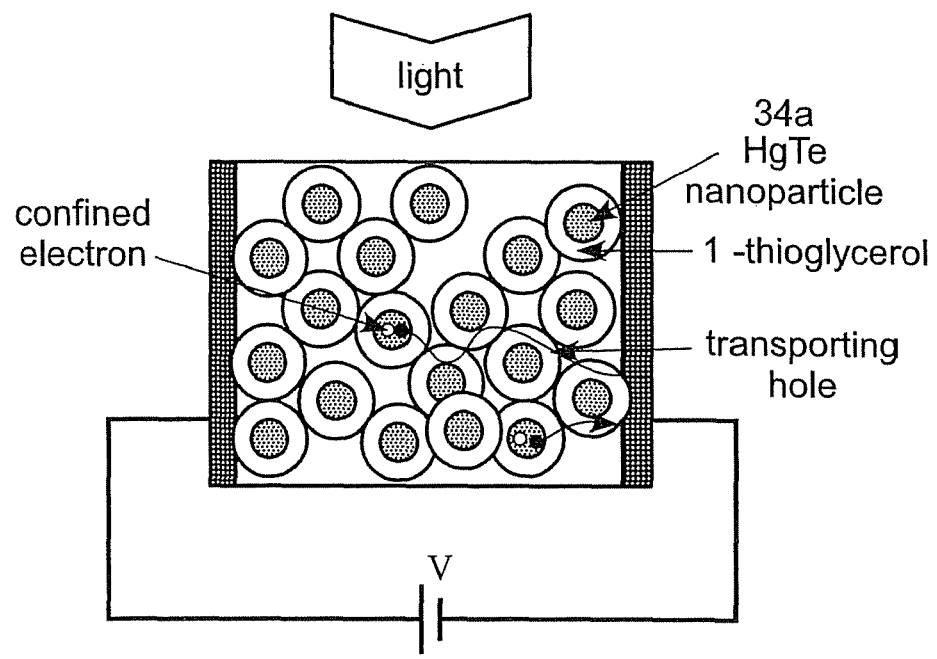
FIG. 4 shows migration of holes through organic channels in a photodetector using nanoparticles in accordance with one embodiment of the present invention.

FIG. 4 shows migration of holes through organic channels in a photodetector 30 using the thus-prepared nanoparticles 34a in accordance with this exemplary embodiment of the present invention. That is, light irradiation to electrons or holes present in valance bands of nanoparticles induces excitation of conduction bands, and excited electrons or holes migrate through the capped organic material, 1-thioglycerol, for example, thereby resulting in current flow.

Meanwhile, the photodetector in accordance with a second embodiment of the present invention comprises close-packed nanoparticles 34b formed by removing organic material capped on the surface of nanoparticles. As described above, nanoparticles having surfaces capped with an organic material were prepared using the conventional wet colloidal synthesis method and then washed with acetone and ethanol to obtain nanoparticles from which the capped organic material had been removed.

Figure 5:
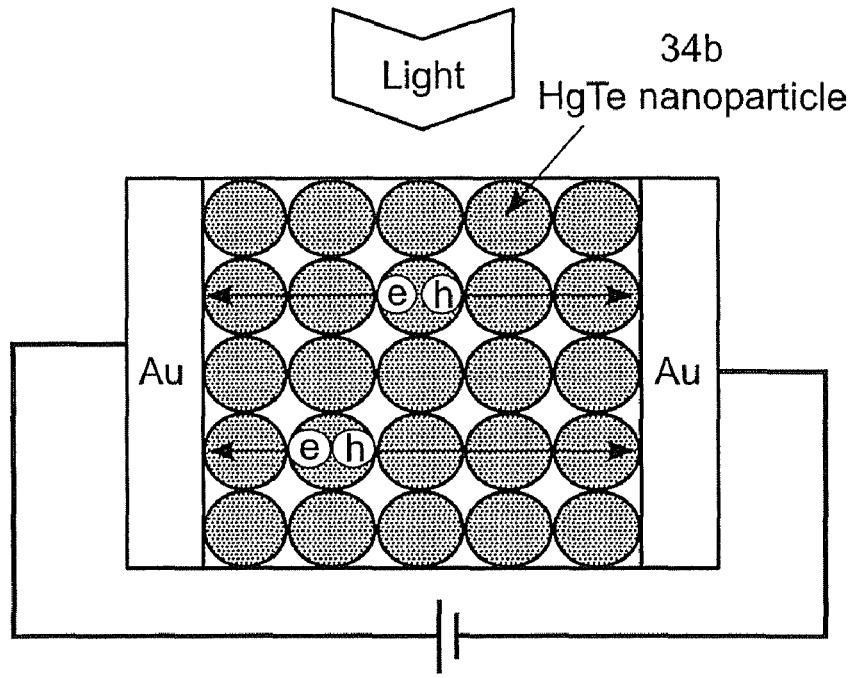
FIG. 5 shows migration of electrons through close-packed nanoparticles, in a photodetector using nanoparticles in accordance with one embodiment of the present invention.

FIG. 5 shows electron migration through close-packed nanoparticles 34b in the photodetector using the thus-prepared nanoparticles in accordance with this exemplary embodiment of the present invention. That is, because the organic material capped on the surfaces of the nanoparticles 34a was removed, electrons excited by light irradiated upon the nanoparticles 34b directly migrate through nanoparticles, thereby resulting in current flow.

As nanocrystals 34 that can be utilized in exemplary embodiments of the photodetector of the present invention, mention may be made of semiconductor nanoparticles selected from the group consisting of HgTe, HgSe, HgS, CdTe, CdSe, CdS, ZnTe, ZnSe, ZnS, PbTe, PbSe, PbS and mixtures thereof. Where nanocrystals are in the form of mixtures, they may be present in the form of a simple mixture, or crystal structures of the respective materials may be partially divided and present in the same particles, or in the form of alloys. Preferably, a nanocrystalline layer composed of nanocrystals in accordance with the present invention has a thickness ranging from several hundreds of nm to several tens of microns.

Among above-mentioned materials, a great deal of attention has been particularly directed to HgTe, because an energy gap of bulk HgTe is almost 0 eV. By controlling a particle size to the range of from 3 nm to 10 nm, HgTe nanoparticles will have the energy gap covering the entire infrared wavelength region ranging from 0.9 µm to several tens of µm.

As organic materials that are capped on surfaces of nanoparticles to serve as channels for electron migration, in the photodetector in accordance with the present invention, they include, but are not limited to, alkyldithiol, mercaptoalkyl alcohol, mercaptoalkyl acid and mixtures thereof.

As specific examples of organic materials, mention may be made of alkyldithiols such as 1-thioglycerol, hexanedithiol, octanedithiol, nonanedithiol and dodecanedithiol; mercaptoalkyl alcohols such as mercaptohexanol and mercaptooctanol; and mercaptoalkyl acids such as mercapto acetic acid and mercapto propionic acid.

Nanoparticles that can be utilized in the present invention include nanoparticles in the form of both single structure and core-shell structures.

Figure 6:
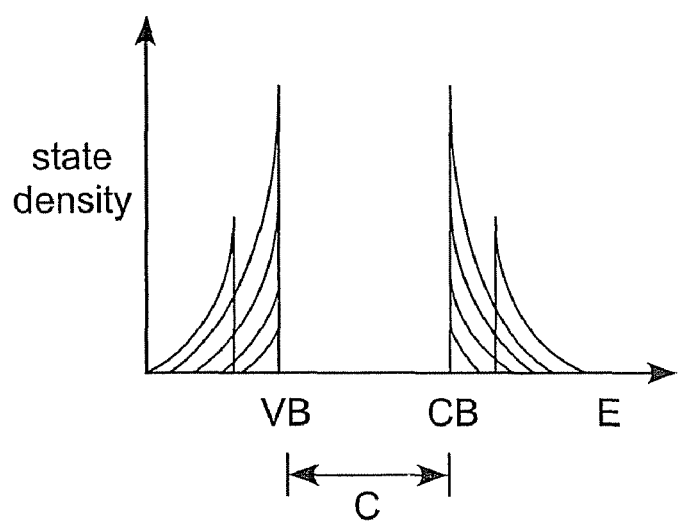
FIG. 6 shows energy state density with respect to particle size of nanoparticles.

Meanwhile, control of the nanoparticle size via use of the wet colloidal synthesis method makes it possible to prepare an optical element capable of selectively receiving light with a particular wavelength within the overall infrared wavelength region. FIG. 6 shows energy state density with respect to particle size of nanoparticles. Controlling nanoparticle size results in control of band gap C, and thereby it is possible to fabricate a photodetector adapted for receiving light with a desired wavelength and a high speed and high efficiency photodetector. The smaller the nanoparticle size, the larger the band gap.

As the substrate for use in the photodetector in accordance with the present invention, conventional substrates may be employed. Specifically, mention may be made of silicon, alumina and glass, as examples.

As materials for the insulating layer used in the photodetector in accordance with the present invention, any material that is conventionally used may be employed. Specifically, mention may be made of $SiO_2$, $Al_2O_3$, Indium Tin Oxide and HfO, as example. Preferably, the insulating layer has a thickness of more than 100 µm.

As electrodes used in the photodetector in accordance with the present invention, any material that is conventionally used may be employed. Specifically, mention may be made of Au, Al, Pt and Cu, as examples.

EXAMPLES

Now, the present invention will be described in more detail with reference to the following Examples. These examples are provided only for illustrating the present invention and should not be construed as limiting the scope and spirit of the present invention.

Preparation Example 1

Figure 7:
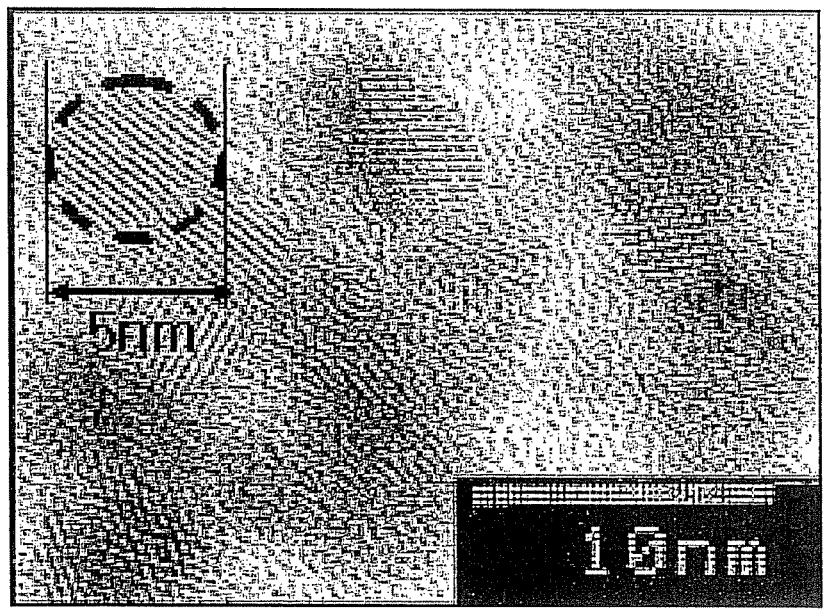
FIG. 7 shows an electron micrograph of HgTe nanoparticles obtained in Preparation Example 1 of the present invention.
Figure 8:
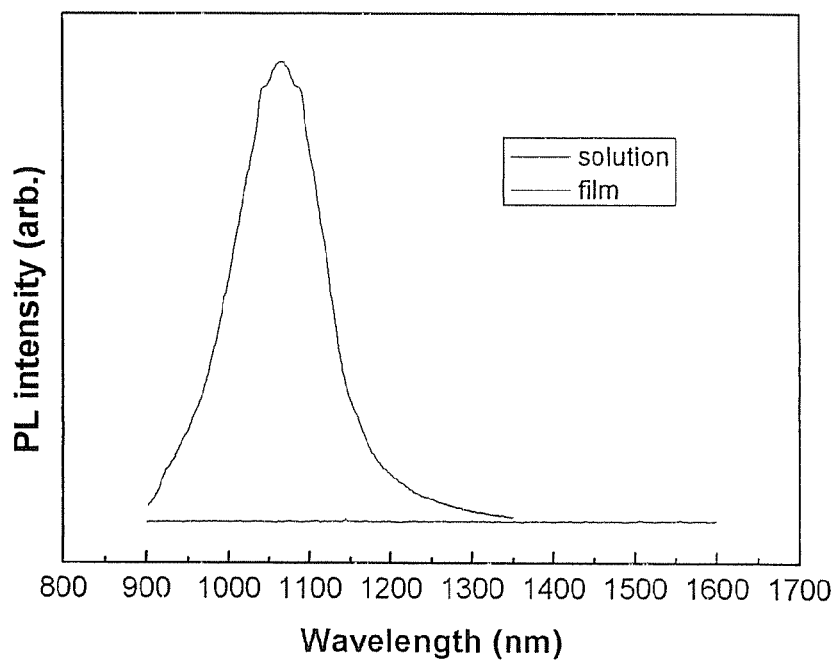
FIG. 8 shows photoluminescence spectra of HgTe nanoparticles obtained in Preparation Example 1 of the present invention, in solution state and thin film state thereof.

Preparation of Organic Material-Capped Nanoparticles 0.94 g (2.35 mmol) of $Hg(ClO_4)_2 3H_2O$ (Aldrich) and 0.5 mL (5.77 mmol) of 1-thioglycerol (Aldrich) were added to 125 mL of ultra pure water. 1M NaOH was then added dropwise thereto to adjust the pH of the resulting solution to 11.63. This solution was charged to a three-necked flask and was bubbled for 30 min under nitrogen gas atmosphere. Next, 0.028 g of $Al_2Te_3$ (Cerac) and 10 mL of 0.5M $H_2SO_4$ were reacted to generate $H_2Te$ gas, and the resulting $H_2Te$ gas and nitrogen gas were passed through the solution. The solution was stirred to facilitate initiation of reaction in the flask and evacuated to vacuum. After reaction, a solvent was removed from the resulting dark brown solution and concentrated to about 30 mL. The concentrated solution was centrifuged to obtain nanoparticle powder. The crystal structure of the thus-prepared nanoparticles was examined under an electron microscope. The results are shown in FIG. 7. In addition, FIG. 8 shows photoluminescence spectra of nanoparticles in solution state and film state.

Example 1

Photodetector Containing Nanoparticles Using Organic Channels

On a silicon substrate on which an insulating layer was formed in the thickness of 300 nm, Au electrodes having a horizontal structure and spaced at a distance of 5 μm relative to each other, fabricated using a photolithography process, were disposed. A solution of HgTe nanoparticles prepared in Preparation Example 1 was re-dispersed in water and the resulting solution was dropped between Au electrodes, followed by drying to prepare a film having a thickness of 10 μm.

Figure 9:
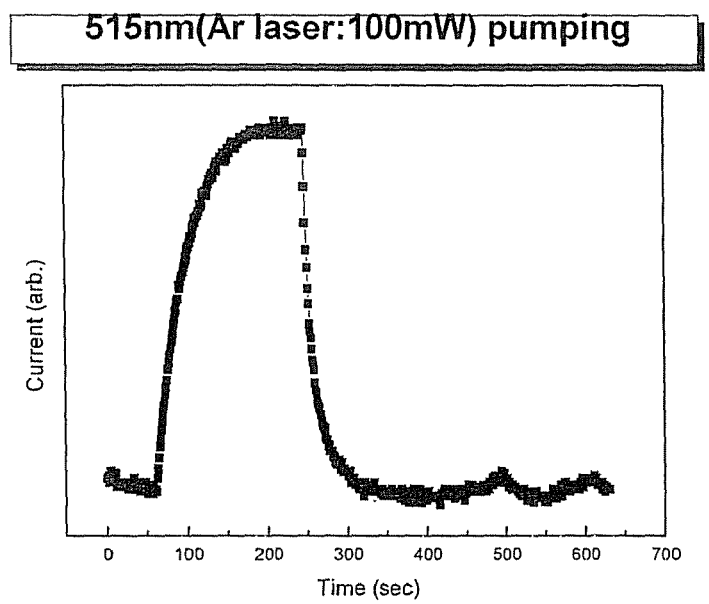
FIGS. 9 and 10 show changes in photocurrent degree of nanoparticles used in a photodetector in accordance with one embodiment of the present invention, with respect to the passage of time.

The thus-prepared HgTe nanoparticle film was irradiated with a light source having a wavelength of 1.1 μm, which is within the near-infrared region, using a Quartz-Tungsten-Halogen (QTH) lamp and a spectroscope, and a current of 3 volts was applied to the electrodes. This was followed by measurement of photocurrent. The results are shown in FIG. 9.

Example 2

Photodetector Containing Organic Material-Removed Nanoparticles

HgTe nanoparticles prepared in Preparation Example 1 were washed with acetone three times for one minute each time and with ethanol once, so as to remove 1-thioglycerol around nanoparticles, followed by drying. The organic material-removed nanoparticles thus obtained were dropped between Au electrodes having a horizontal structure and spaced at a distance of 5 μm relative to each other, fabricated using a photolithography process, on a silicon substrate having a 300 nm insulating layer formed thereon, and then was dried to prepare a film having a thickness of 10 μm.

Figure 10:
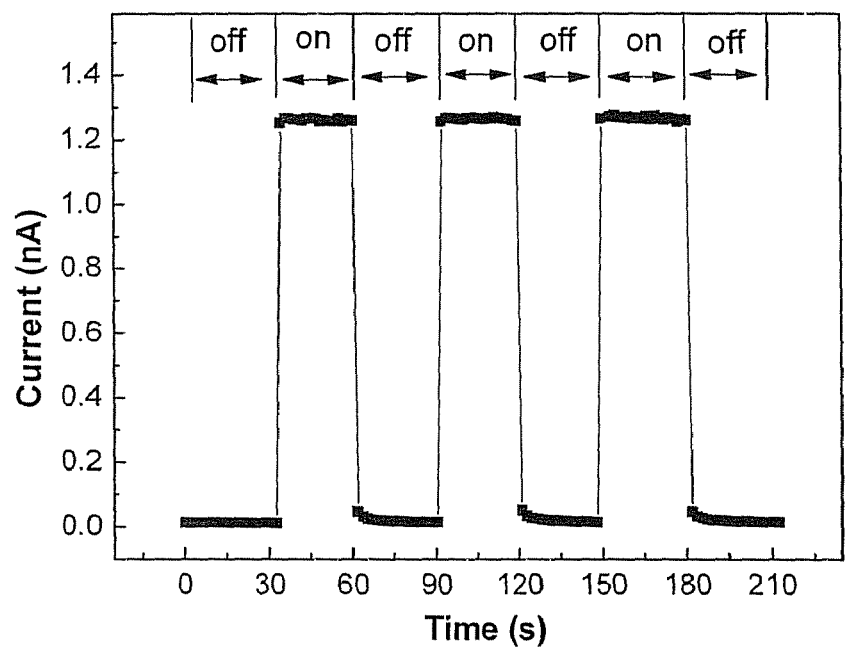

The thus-prepared HgTe nanoparticle film was irradiated with a light source having a wavelength of 1.1 μm, which is within the near-infrared region, using a Quartz-Tungsten-Halogen (QTH) lamp and a spectroscope, and a current of 3 volts was applied to the electrodes. This was followed by measurement of photocurrent. The results are shown in FIG. 10.

As described above, since the photodetector in accordance with the present invention uses nanoparticles formed by wet chemical methods, it is possible to effect economical and mass production of the photodetector. In addition, since current carriers can migrate through the organic material capped on the nanoparticle surface or organic material-removed nanoparticles, it is possible to simplify the photodetector structure and manufacturing process. Further, utilization of isotropic quantum effects of nanoparticles enables fabrication of high-efficiency photodetectors.

Also, when the photodetector is fabricated using nanoparticles in accordance with the present invention, wavelengths that are desired to receive and detect are variable over the entire infrared region and thus the photodetector is applicable to a very wide area such as application to infrared detection devices for optical communication and military purpose.

Although the preferred embodiments of the present disclosure have been disclosed for illustrative purposes, those skilled in the art will appreciate that various modifications, additions and substitutions are possible, without departing from the scope and spirit of the invention as disclosed in the accompanying claims.

What is claimed is:

1. A method of synthesizing a photodetector comprising:
   forming a substrate;
   forming an insulating layer formed on the substrate;
   forming two opposite electrodes disposed on the insulating layer at a predetermined distance; and
   forming a nanocrystalline layer comprising nanoparticles having organic material-capped surfaces formed between two opposite electrodes,
   wherein a method of synthesizing the nanoparticles having organic material-capped surfaces is according to a wet colloidal synthesis method, wherein the organic material is selected from the group consisting of alkyldithiol, mercaptoalkyl alcohol, mercaptoalkyl acid, and mixtures thereof.

2. The method according to claim 1, wherein the method of synthesizing the nanoparticles further comprises concentrating a solution composed of synthesized nanoparticles having organic material-capped surfaces.

3. The method according to claim 1, wherein the nanoparticles are semiconductor nanoparticles selected from the group consisting of HgTe, HgSe, HgS, CdTe, CdSe, CdS, ZnTe, ZnSe, ZnS, PbTe, PbSe, PbS and mixtures thereof.

4. The method according to claim 1, wherein the organic material is selected from the group consisting of 1-thioglycerol, hexanedithiol, octanedithiol, nonanedithiol, dodecanedithiol, mercaptohexanol, mercaptooctanol, mercapto acetic acid, mercapto propionic acid, and mixtures thereof.

5. The method according to claim 1, wherein the nanoparticles have at least one of single structures and core-shell structures.

6. The method according to claim 1, wherein the insulating film is selected from the group consisting of $SiO_2$, $Al_2O_3$, Indium Tin Oxide and HfO.

7. The method according to claim 1, wherein the electrodes are selected from the group consisting of Au, Al, Pt and Cu.

8. The method according to claim 1, wherein the nanoparticles are uniformly distributed in close proximity to each other and have a uniform size.

* * * * *